United States Patent [19]

Okumura

[11] Patent Number: 5,714,799
[45] Date of Patent: Feb. 3, 1998

[54] RESIN-SEALED TYPE SEMICONDUCTOR DEVICE HAVING AN UNOCCUPIED SECOND DIE PAD

[75] Inventor: Naohisa Okumura, Yokohama, Japan

[73] Assignee: Kabushiki Kaisha Toshiba, Kawasaki, Japan

[21] Appl. No.: 768,920

[22] Filed: Dec. 18, 1996

Related U.S. Application Data

[63] Continuation of Ser. No. 581,781, Dec. 29, 1995, abandoned, which is a continuation of Ser. No. 339,259, Nov. 10, 1994, abandoned.

[30] Foreign Application Priority Data

Dec. 3, 1993 [JP] Japan ................... 5-303632

[51] Int. Cl.$^6$ ............................................. H01L 23/495
[52] U.S. Cl. ........................ 257/676; 257/666; 257/787
[58] Field of Search ............................. 257/676, 666, 257/787, 723

[56] References Cited

U.S. PATENT DOCUMENTS

| | | | |
|---|---|---|---|
| 5,049,977 | 9/1991 | Sako | 257/676 |
| 5,221,859 | 6/1993 | Kobayashi et al. | 257/676 |

*Primary Examiner*—Jerome Jackson
*Assistant Examiner*—Nathan K. Kelley
*Attorney, Agent, or Firm*—Finnegan, Henderson, Farabow, Garrett & Dunner, L.L.P.

[57] ABSTRACT

A resin-sealed type semiconductor device is provided which has a lead array with a plurality of leads arranged at a predetermined interval. A first die pad is provided substantially flush with the lead array. A semiconductor chip is mounted on the first pad and electrically connected to the lead array. A second die pad is arranged in a separate, side-by-side relation to the first die pad. The portion of the lead array, first die pad with the semiconductor chip mounted thereon and second die pad are covered with a resin molding body as an integral unit.

3 Claims, 2 Drawing Sheets

RESIN-SEALED TYPE SEMICONDUCTOR DEVICE HAVING AN UNOCCUPIED SECOND DIE PAD

This application is a continuation of application Ser. No. 08/581,781 filed Dec. 29, 1995, which is a continuation of application Ser. No. 08/339,259, filed Nov. 10, 1994, both now abandoned.

BACKGROUND OF THE INVENTION

1. Field of the Invention

The present invention relates to a resin-sealed type semiconductor device equipped with a package unit having a plurality of leads at one side and, in particular, to a resin-sealed type semiconductor device which can eliminate package curling particularly at a molding step.

2. Description of the Related Art

Conventionally, a resin-sealed type package with a plurality of leads arranged on one side has been extensively used as a package for a semiconductor device ensuring better mount efficiency. Known as such are, for example, a single in-line package (SIP) and a zigzag in-line package (ZIP).

FIG. 1 is a cross-sectional view showing a typical form of the resin-sealed type package. A semiconductor chip 13 is mounted on a die pad 12 and connected by bonding wires 14 to leads 15. The die pad 12, semiconductor chip 13, leads 15 and bonding wires 14 are molded into an integral unit with the leads 15 partially extending out of the molded unit.

FIG. 2 is a plan view showing a unit lead frame 11 so provided as to correspond to one semiconductor chip 13.

The die pad 12 of the unit lead frame 11 is so depressed that its tie bars 17 provide steps relative to an outer frame 18. A plurality of leads 15 are provided on the unit lead frame 11.

The resin-sealed type package has been standardized regarding the number of leads and the size of the package. Therefore, the number of leads is specified for any particular package selected.

In order to obtain a greater number of semiconductor chips from a single sheet of a wafer, the chip size has been made more miniaturized correspondingly. If, therefore, such miniaturized semiconductor chip needs to be molded into any selected package with a specified number of leads provided therein, there arises a problem as will be set out below.

There are sometimes the cases where a miniaturized semiconductor chip 13 needs to be positively held in place in a larger package. In this case, the position in which the semiconductor chip 13 is mounted on the die pad 12 is restricted due to the presence of the bonding wires 14 so that the semiconductor chip 13 is positioned near the leads 15.

With a molding step done in such a situation, the semiconductor chip 13 and die pad 12 are covered with a resin in which case the resin layer thickness differs, due to the presence of a single die pad 12, between a layer thickness above the semiconductor chip 13 and a layer thickness above the die pad 12. When heat is applied under this condition to the semiconductor device upon mounting, a thermal stress is developed in the interior of the package. The thermal stress differs from place to place of a package interior, thus producing curling as shown in FIG. 3. Such curing has often caused a breakage to the semiconductor chip 13 and package.

It has, thus, been indicated that, if any semiconductor chip 13 smaller in size than a die pad is mounted in the manufacture of a resin-sealed type semiconductor device equipped with a package with a plurality of leads arranged on its one side, the package suffers curling.

SUMMARY OF THE INVENTION

It is accordingly the object of the present invention to provide a resin-sealed type semiconductor device which, by providing a semiconductor chip-mounted die pad and a chipless die pad in a separate way in place of a conventional, integral single die pad structure, can eliminate package curling, through the utilization of a thermal stress distribution in the package, even if the semiconductor chip smaller in size than the die pad is mounted.

According to the present invention, there is provided a resin-sealed type semiconductor device comprising:

a lead array having a plurality of leads arranged at a predetermined interval;

a first die pad located in substantially the same plane as the lead array;

a semiconductor chip mounted on the first die pad and electrically connected to the lead array;

a second die pad separated from the first die pad in a side-by-side relation;

a resin molding body with which the portion of the lead array situated on the first die pad side, first die pad with the semiconductor chip mounted thereon, and second die pad are covered as an integral unit.

With the resin-selaed type semiconductor device so constructed, the die pad structure is divided into a semiconductor chip-mounted first die pad and chipless second die pad so that thermal stress can be properly distributed in the package interior. By so doing, no curling occurs in the package.

In the resin-sealed type semiconductor device, a step is provided between the first die pad and the second die pad and the resin molding unit is such that a resin layer overlying the semiconductor chip is made substantially equal in thickness to a resin layer underlying the first die pad and the resin layer overling the second die pad is made substantially equal in thickness to the resin layer underlying the second die pad. This specific structure further improves a thermal stress unbalance and can solve any curling problem which would otherwise occur in the package.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

An embodiment of the present invention will be explained below with reference to the accompanying drawings.

Figure 1:
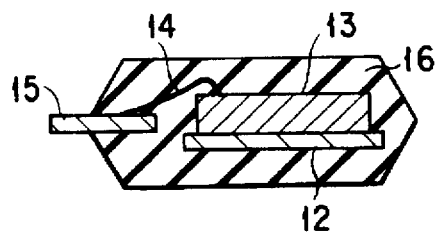
FIG. 1 is a cross-sectional view showing an internal structure of a conventional resin-sealed type semiconductor device.
Figure 2:
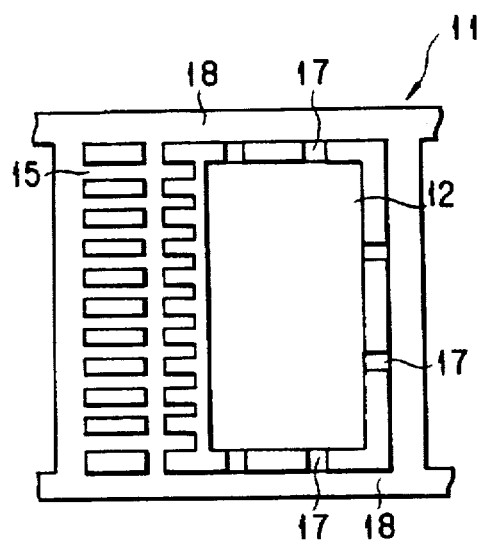
FIG. 2 is a plan view showing a lead frame of a conventional unit semiconductor device.
Figure 3:
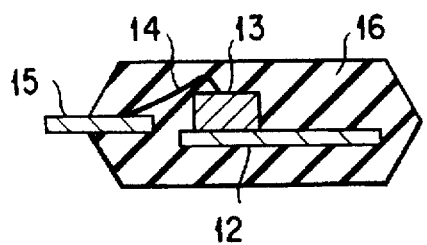
FIG. 3 is a cross-sectional view showing an inner structure of the conventional resin-sealed type semiconductor device in a curled state.
Figure 4:
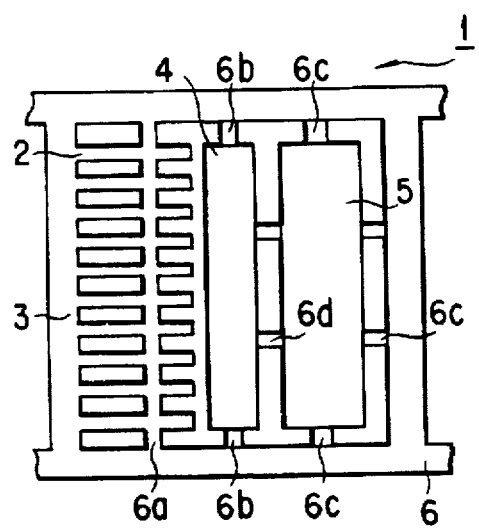
FIG. 4 is a plan view showing a lead frame of a unit semiconductor device according to a first embodiment of the present invention.

FIG. 4 is a plan view showing a lead frame of one semiconductor element according to a first embodiment of the present invention. The lead frame 1 comprises a lead array 3 equipped with a plurality of leads to be separated at a later step, a first pad 4 on which a semiconductor chip is mounted, a second pad 5 serving as a dummy pad where no semiconductor chip is mounted, and a connection frame 6 for connecting together these pads 4 and 5 and lead array 3. The connection frame 6 connects together a plurality of unit semiconductor elements. The connection frame comprises a dam bar 6a connecting together a plurality of leads 2, tie bars 6b for supporting the first pad 4, tie bars 6c for supporting the second pad 5, and tie bars 6d for connecting together the first and second pads 4 and 5.

Figure 6:
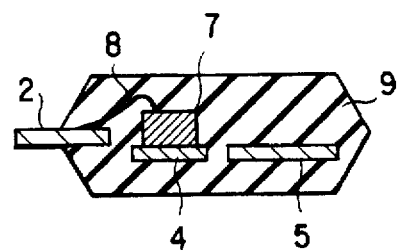
FIG. 6 is a cross-sectional view, as taken along a line A—A in FIG. 5, showing an inner structure of the resin-sealed type semiconductor device.

The first and second pads 4 and 5 are depressed with respect to lead 2 so that no step is provided between these pads, as appreciated from FIG. 6. When the semiconductor chip is mounted on the first pad 4 and a resultant structure is resin-sealed, a resin layer overlying the semiconductor chip is substantially equal in thickness to a resin layer underlying the first pad 4. Stated in more detail, the amount of depression with respect to lead 2 is made desirably equal to about one half a total thickness of the thickness of the semiconductor chip 7 plus the thickness of an electroconductive mount material (not shown).

Figure 5:
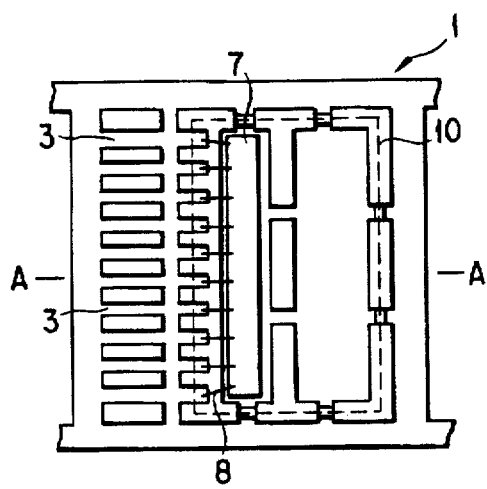
FIG. 5 shows the lead frame of FIG. 4 with a semiconductor chip mounted thereon in a wire-bonded state.

A semiconductor chip 7 is mounted on the first pad 4, as shown in FIG. 5, with the use of an electroconductive mount material. Then the bonding pads on the semiconductor chip 7 side are connected to the bonding pads on the lead array 3 side by bonding wires 8.

The lead frame 1 with the semiconductor chip 7 mounted thereon is set on a transfer molding machine, not shown. A resin, being melted by the application of heat, is poured under high pressure into a mold by the machine.

The resin is filled at an area as indicated by a dotted line 10 in FIG. 5 to provide a unit resin molding 9 as indicated by a cross-sectional view in FIG. 6. The unit resin molding 9, being cured, is removed, as a unit "molded" lead frame, from the mold and then a connection frame portion 6 is cut relative to the lead array 3 to provide a complete semiconductor device as shown in FIG. 6.

Although the semiconductor device has been shown as being of a single in-line package type, it may be made a zigzag in-line package (ZIP) and surface vertical package (SVP) type by properly forming leads 2.

Since, in the structure above, the first and second pads 4 and 5 are separated except at the locations of tie bars, any stress, if being produced at those boundary areas between the resin layer and the respective pads 4, 5, is properly divided and the stress per se is reduced only by an extent to which the area of the pad is decreased, so that curling is less liable to be produced.

A second embodiment of the present invention will be explained below with reference to FIGS. 7 and 8.

Figure 7:
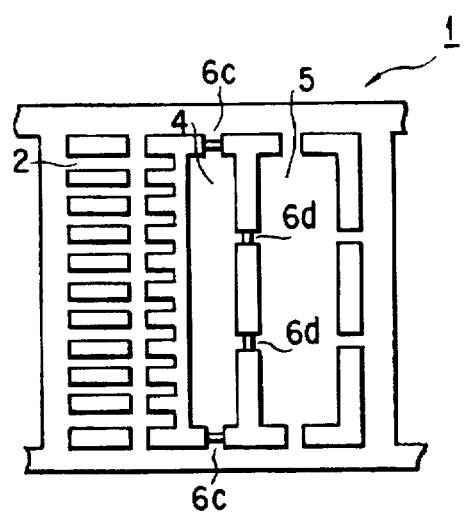
FIG. 7 is a plan view showing a lead frame of a unit semiconductor device according to another embodiment of the present invention.

A unit lead frame 1 as shown in FIG. 7 is of such a type that a step is provided by depressing a first pad 4 only to allow those tie bars 6c, 6d to be deformed and hence a molding position of the first pad 4 to be made deeper than a molding position of a second pad 5. Then, as in the same way as set out in conjunction with FIG. 5, a semiconductor chip 7 is mounted on the first pad 4 and bonding is carried out, followed by forming a resultant semiconductor structure by molding with a resin. A complete semiconductor device is provided as indicated by a cross-sectional view in FIG. 8.

Figure 8:
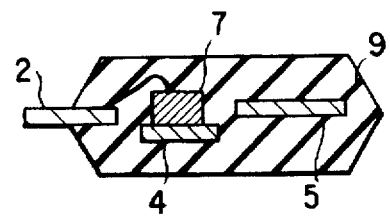
FIG. 8 is a cross-sectional view showing an inner structure of the device of FIG. 7.

As evident from the cross-sectional view of a semiconductor device as shown in FIG. 8, a resin layer overlying the semiconductor chip 7 is made equal in thickness to a resin layer underlying the first pad 4 and the overlying layer of the second pad 5 is made equal in thickness to the underlying layer of the second pad 5. The package is less liable to curl.

Figure 9:
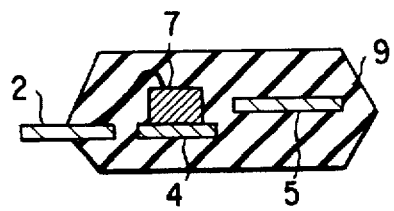
FIG. 9 is a cross-sectional view showing an inner structure according to another embodiment of the present invention.

A third embodiment of the present invention will be explained below with respect to FIG. 9.

In the third embodiment, out of first and second pads 4 and 5, the second pad 5 is depressed from below and, after a step is provided between the first and second pads 4 and 5, a resultant semiconductor structure is sealed with a resin 9. Even with the third embodiment, a resin layer overlying a semiconductor chip 7 is made equal in thickness to a resin layer underlying the first pad 4 and the resin layer overlying the second pad 5 is made equal in thickness to the resin layer underlying the second pad 5. The resin 9, being adequately thick, provides an adequate holding strength to the leads 2 and there is, therefore, no holding strength problem. Rather, since the leads 2 and first pad 4 are situated flush with each other, a bonding jig can be simplified.

The resin-sealed type semiconductor device of the present invention is not restricted to the aforementioned embodiments and various changes or modifications of the present invention can be made without departing from the spirit and scope of the present invention. For example, foil-like conductors may be used in the aforementioned embodiment in place of the bonding wires.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resin-sealed type semiconductor device comprising:

a plurality of leads arranged in a first plane;

a first die pad in a second plane;

an unoccupied second die pad in the second plane;

tie bars connected between said first die pad and said unoccupied second die pad, said plurality of leads and said unoccupied second die pad lying on opposite sides of said first die pad;

a semiconductor chip mounted on said first die pad and electrically connected to said plurality of leads; and a resin molding body covering said first die pad, said unoccupied second die pad, said semiconductor chip, and a side portion of each of said plurality of leads, said resin molding body having a first thickness of resin overlying said semiconductor chip and a second thickness of resin underlying said first die pad on which said semiconductor chip is mounted, wherein said first and second thicknesses of resin are substantially equal.

2. A resin-sealed type semiconductor device comprising:

a plurality of leads arranged in a first plane;

a first die pad in a second plane;

a unoccupied second die pad in the first plane;

tie bars connected between said first die pad and said unoccupied second die pad, said plurality of leads and said unoccupied second die pad lying on opposite sides of said first die pad;

a semiconductor chip mounted on said first die pad and electrically connected to said plurality of leads; and a resin molding body covering said first die pad, said unoccupied second die pad, said semiconductor chip, and a side portion of each of said plurality of leads, said resin molding body having a first thickness of resin overlying said semiconductor chip, a second thickness of resin underlying said first die pad on which said semiconductor chip is mounted, a third thickness of resin overlying said unoccupied second die pad, and a fourth thickness of resin underlying said unoccupied second die pad, wherein said first and second thicknesses of resin are substantially equal and said third and fourth thicknesses of resin are substantially equal.

3. A resin-sealed type semiconductor device comprising:

a plurality of leads arranged in a first plane;

a first die pad in the first plane;

an unoccupied second die pad in a second plane;

tie bars connected between said first die pad and said unoccupied second die pad, said plurality of leads and said unoccupied second die pad lying on opposite sides of said first die pad;

a semiconductor chip mounted on said first die pad and electrically connected to said plurality of leads; and a resin molding body covering said first die pad, said unoccupied second die pad, said semiconductor chip, and a side portion of each of said plurality of leads, said resin molding body having a first thickness of resin overlying said semiconductor chip, a second thickness of resin underlying said first die pad on which said semiconductor chip is mounted, a third thickness of resin overlying said unoccupied second die pad, and a fourth thickness of resin underlying said unoccupied second die pad, wherein said first and second thicknesses of resin are substantially equal and said third and fourth thicknesses of resin are substantially equal.

* * * * *